(12) United States Patent
Sato

(10) Patent No.: US 10,243,032 B2
(45) Date of Patent: Mar. 26, 2019

(54) DISPLAY DEVICE

(71) Applicant: Japan Display Inc., Minato-ku (JP)

(72) Inventor: Toshihiro Sato, Minato-ku (JP)

(73) Assignee: Japan Display Inc., Minato-ku (JP)

( * ) Notice: Subject to any disclaimer, the term of this patent is extended or adjusted under 35 U.S.C. 154(b) by 0 days.

(21) Appl. No.: 15/661,514

(22) Filed: Jul. 27, 2017

(65) Prior Publication Data

US 2018/0012951 A1 Jan. 11, 2018

Related U.S. Application Data

(63) Continuation of application No. PCT/JP2016/052029, filed on Jan. 25, 2016.

(30) Foreign Application Priority Data

Jan. 28, 2015 (JP) ................................. 2015-014573

(51) Int. Cl.
*H01L 27/14* (2006.01)
*H01L 27/32* (2006.01)
(Continued)

(52) U.S. Cl.
CPC .......... *H01L 27/3274* (2013.01); *H01L 27/15* (2013.01); *H01L 29/06* (2013.01);
(Continued)

(58) Field of Classification Search
CPC . H01L 27/286; H01L 27/322; H01L 27/3274; H01L 51/0554; H01L 51/502; H01L 51/5296
(Continued)

(56) References Cited

U.S. PATENT DOCUMENTS

2008/0149921 A1* 6/2008 Choi ...................... B82Y 20/00
257/40
2008/0217602 A1 9/2008 Kahen
(Continued)

FOREIGN PATENT DOCUMENTS

JP 9-260611 10/1997
JP 2008-53293 3/2008
(Continued)

OTHER PUBLICATIONS

International Search Report dated Apr. 12, 2016 in PCT/JP2016/052029 filed Jan. 25, 2016 (with English translation).
(Continued)

*Primary Examiner* — Long K Tran
(74) *Attorney, Agent, or Firm* — Oblon, McClelland, Maier & Neustadt, L.L.P.

(57) ABSTRACT

A selection transistor and a light-emitting transistor are formed in a pixel. The selection transistor includes a gate electrode connected to a scan line, a first source/drain electrode connected to a signal line, and a second source/drain electrode. The light-emitting transistor includes a gate electrode connected to the second source/drain electrode of the selection transistor, a first electrode connected to a first line, a second electrode connected to a second line, and a channel layer including quantum dots. The light-emitting transistor controls the quantum dots to emit light by a carrier flowing through the channel layer.

11 Claims, 16 Drawing Sheets

(51) Int. Cl.
*H01L 29/786* (2006.01)
*H01L 27/15* (2006.01)
*H01L 29/06* (2006.01)
*H01L 33/06* (2010.01)
*H05B 33/14* (2006.01)
*H01L 51/50* (2006.01)
*H01L 51/52* (2006.01)
*H01L 27/28* (2006.01)
*H01L 51/05* (2006.01)

(52) U.S. Cl.
CPC ............ *H01L 29/786* (2013.01); *H01L 33/06* (2013.01); *H01L 51/502* (2013.01); *H01L 51/5296* (2013.01); *H05B 33/14* (2013.01); *H01L 27/286* (2013.01); *H01L 27/322* (2013.01); *H01L 51/0554* (2013.01)

(58) Field of Classification Search
USPC ......................................................... 257/72
See application file for complete search history.

(56) References Cited

U.S. PATENT DOCUMENTS

2009/0189161 A1   7/2009   Honda
2012/0280208 A1   11/2012  Jain

FOREIGN PATENT DOCUMENTS

| JP | 2009-206505 | 9/2009 |
| JP | 2010-520603 | 6/2010 |
| JP | 2010-209141 | 9/2010 |
| JP | 2014-78381  | 5/2014 |

OTHER PUBLICATIONS

International Preliminary Report on Patentability and Written Opinion dated Aug. 10, 2017 in PCT/JP2016/052029 (With English language translation).

* cited by examiner

DISPLAY DEVICE

CROSS-REFERENCE TO RELATED APPLICATION

The present application is a continuation of International Patent Application under the PCT No. PCT/JP2016/052029 filed in the Japan Patent Office on Jan. 25, 2016, which claims priority from Japanese application No. 2015-014573 filed on Jan. 28, 2015, the entire contents of which are hereby incorporated by reference into this application.

BACKGROUND OF THE INVENTION

1. Field of the Invention

The present invention relates to a display device using quantum dots.

2. Description of the Related Art

Quantum dots (quantum boxes) can confine electric charges in dot-shaped regions. Generally, the quantum dots are fine particles composed of approximately several hundreds to several thousands of atoms. An active matrix type display device using the quantum dots is disclosed in JP2010-520603A (hereinafter, referred to as PTL 1). In this display device, each pixel includes an inorganic light emitting diode where a light emitting layer containing quantum dots is interposed between two electrodes. In addition, the display device of PTL 1 includes a power transistor, a selection transistor, and a storage capacitor (storage capacitor in PTL 1) in each pixel. The power transistor controls electric current supplied to the inorganic light emitting diode. The selection transistor is connected to a scan line (select line in PTL 1) and a signal line (data line in PTL 1), and applies a voltage corresponding to a signal received from the signal line to a gate of the power transistor. The storage capacitor maintains the voltage of the gate of the power transistor. A light emitting device in which a light emitting layer including the quantum dots is interposed between two electrodes is disclosed in JP2010-209141A.

SUMMARY OF THE INVENTION

Recently, higher definition of a display device has progressed. Increasing the definition of the display device requires the size of one pixel to be smaller and thus makes forming many circuit elements (above-described transistors and capacitors) in each pixel more difficult.

The present specification has an object to propose a display device which uses quantum dots and can reduce the number of circuit elements in each pixel.

A display device according to the present invention includes a plurality of pixels; a scan line; a signal line; a first line; a second line. At least one pixel among the plurality of pixels includes a selection transistor and a light-emitting transistor. The selection transistor includes a gate electrode connected to the scan line, a first source/drain electrode connected to the signal line, and a second source/drain electrode. The light-emitting transistor includes a gate electrode to which a voltage corresponding to a gradation value of the at least one pixel is applied through the second source/drain electrode of the selection transistor, a first electrode connected to the first line, a second electrode connected to the second line, and a channel layer including quantum dots, and controls the quantum dots to emit light by carriers flowing through the channel layer.

DETAILED DESCRIPTION OF THE INVENTION

Figure 1:
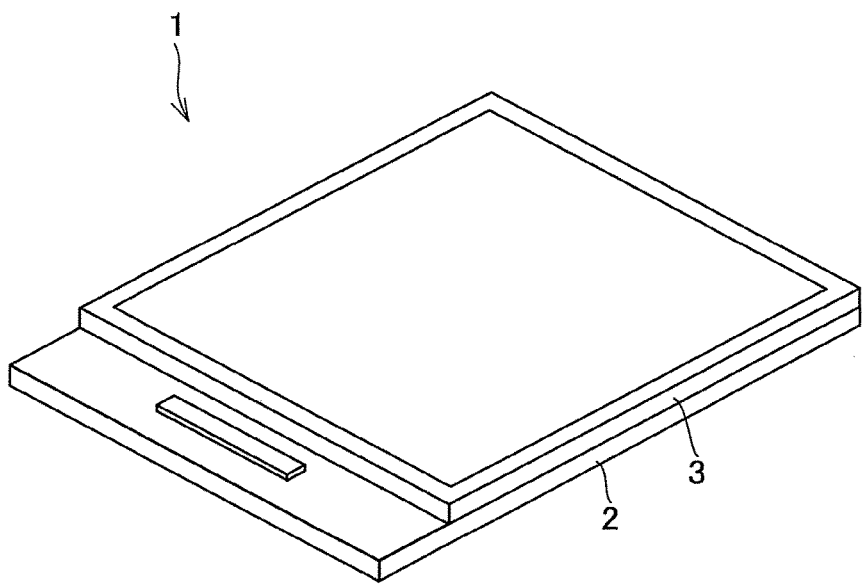
FIG. 1 is a perspective view of a display device according to an embodiment of the present invention.

Hereinafter, embodiments of the present invention will be described. The disclosure of the present specification is merely an example of the present invention, and appropriate changes keeping the gist of the present invention, which can easily be conceived by those skilled in the art, are included in the scope of the present invention. In addition, the width, thickness, shape, or the like of each portion illustrated in the drawings may be schematically represented, and they do not limit the interpretation of the present invention.

FIG. 1 is a perspective view of a display device 1 according to an embodiment of the present invention. The display device 1 includes a thin film transistor (TFT) substrate 2. The display device 1 may include a counter substrate 3 opposing the TFT substrate 2. The display device 1 may not include the counter substrate 3. The display device 1 has a plurality of pixels arranged in a vertical direction and a horizontal direction. It is preferable that the display device 1 includes the plurality of pixels that emit light beams having different colors from each other. For example, colors of the pixels are three colors of red, green, and blue, or four colors of red, green, blue, and white. As the colors of pixels, cyan, magenta, and yellow may be included.

Figure 2:
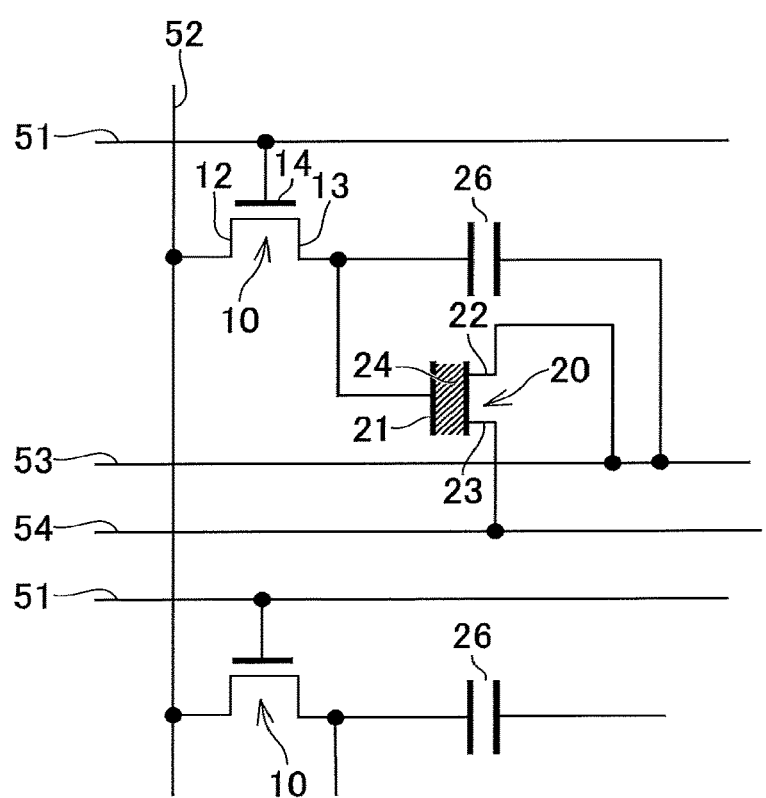
FIG. 2 is a diagram illustrating an example of a circuit formed in each pixel.
Figure 3A:
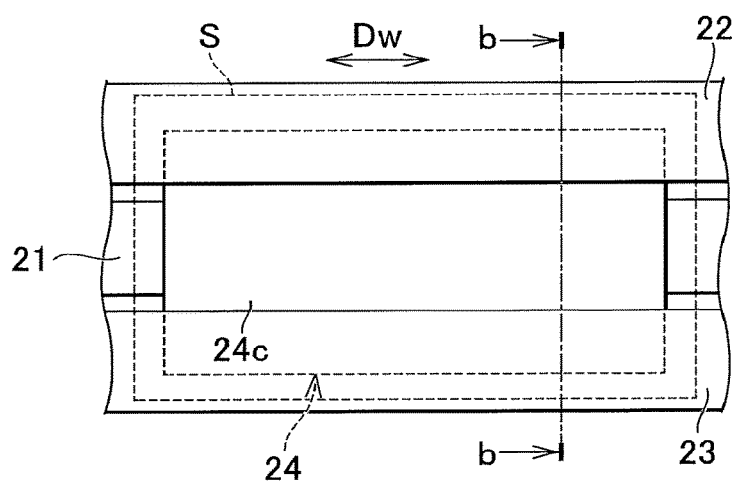
FIG. 3A is a plan view schematically illustrating an example of a light-emitting transistor in each pixel.
Figure 3B:
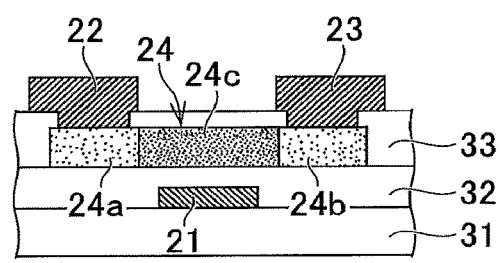
FIG. 3B is a sectional view of the light-emitting transistor illustrated in FIG. 3A.

FIG. 2 is a diagram illustrating an example of a circuit formed in each pixel. The circuit is formed on the TFT substrate 2. FIG. 3A and FIG. 3B are diagrams schematically illustrating an example of a light-emitting transistor 20. FIG. 3A is a plan view thereof, and FIG. 3B is a sectional view taken along the line b-b of FIG. 3A.

As illustrated in FIG. 2, the display device 1 includes a plurality of scan lines 51 and a plurality of signal lines 52. The scan lines 51 and the signal lines 52 are orthogonal to each other. The scan line 51 is connected to a scan line driving circuit (not illustrated). A scan signal from the scan line driving circuit is applied to the scan lines 51. The signal line 52 is connected to a signal line driving circuit (not illustrated). A signal (voltage) corresponding to a gradation value of each pixel is applied to the signal lines 52 from the signal line driving circuit. The display device 1 includes a first line 53 and a second line 54 that has a potential different from that of the first line 53. As an example, the potential of the first line 53 and the potential of the second line 54 are constant. The first line 53 and the second line 54 of FIG. 2 extend in a direction along the scan lines 51. However, the extending direction of these lines 53 and 54 is not limited thereto.

Each pixel includes a selection transistor 10 and the light-emitting transistor 20. The selection transistor 10 includes a gate electrode 14 connected to the scan lines 51, a first source/drain electrode 12 connected to the signal line 52, and a second source/drain electrode 13.

The light-emitting transistor 20 includes a gate electrode 21 connected to the second source/drain electrode 13 of the selection transistor 10. A voltage corresponding to a gradation value of the pixel is applied to the gate electrode 21 via the second source/drain electrode 13. The gate electrode 21 may be directly connected to the second source/drain electrode 13. Alternatively, the gate electrode 21 may be indirectly connected to the second source/drain electrode 13 via another circuit element. In addition, the light-emitting transistor 20 includes a first electrode 22 electrically connected to the first line 53 and a second electrode 23 electrically connected to the second line 54. In a laminated structure of the TFT substrate 2, the first line 53 and the first electrode 22 may be formed on conductive layers different from each other. Alternatively, the first line 53 and the first electrode 22 may be formed on the same conductive layer. In a case where the first line 53 and the first electrode 22 are formed on the same conductive layer, apart of the first line 53 may function as the first electrode 22. Similarly, the second line 54 and the second electrode 23 may be formed on conductive layers different from each other. Alternatively, the second line 54 and the second electrode 23 may be formed on the same conductive layer. In a case where the second line 54 and the second electrode 23 are formed on the same conductive layer, a part of the second line 54 may function as the second electrode 23.

As illustrated in FIG. 3A and FIG. 3B, the light-emitting transistor 20 includes a channel layer 24 having quantum dots, and controls the quantum dots to emit light by carriers flowing through the channel layer 24. The quantum dots are semiconductor fine particles that can confine electric charges in a dot shape region. Generally, the quantum dot is composed of several hundreds to several thousands of atoms and has a particle size of approximately several nanometers (nm) to 20 nm. For example, the quantum dot has a core-shell type structure including a semiconductor particle (core portion) and a shell portion covering a surface of the core portion and having band gap energy larger than that of the core portion.

The core portions employ particles emitting visible light by recombination of electrons and holes. Specifically, the core portion may employ semiconductor crystals that include semiconductors or semiconductor compounds including II-VI semiconductor compound (for example, MgS, MgSe, MgTe, CaS, CaSe, CaTe, SrS, SrSe, SrTe, BaS, BaSe, BaTe, ZnS, ZnSe, ZnTe, CdS, CdSe, CdTe, HgS, HgSe, and HgTe), III-V semiconductor compound (for example, AlN, AlP, AlAs, AlSb, GaAs, GaP, GaN, GaSb, InN, InAs, InP, InSb, TiN, TiP, TiAs, and TiSb), IV semiconductor compound (for example, Si, Ge and Pb). In addition, the core portion may employ a semiconductor crystal containing a semiconductor compound containing three or more elements such as InGaP. The shell portion has desirably employ, as its material, a semiconductor material having the band gap energy larger than that of the material of the core portion. By using such a material, it is possible to effectively confine the electric charges in the core portion of the quantum dots. For example, as such a core shell structure (core/shell), CdSe/ZnS, CdSe/ZnSe, CdSe/CdS, CdTe/CdS, InP/ZnS, Gap/ZnS, Si/ZnS, InN/GaN, InP/CdSSe, InP/ZnSeTe, InGaP/ZnSe, InGaP/ZnS, Si/Alp, InP/ZnSTe, InGaP/ZnSTe, InGap/ZnSSe, and the like can be exemplified.

As a method of forming the quantum dots, known methods can be used. For example, a gas phase synthesis method, a liquid phase synthesis method, a solid phase synthesis method, a vacuum synthesis method, or the like can be used. In the liquid phase synthesis method, synthesis methods such as a hot soap method, a reverse micelle method, a solvothermal method, a hydrothermal method, and a coprecipitation method can be used.

The quantum dots emit light of a color (wavelength) according to its size (particle size). Therefore, a size of the quantum dots included in the channel layer 24 is controlled so that the quantum dots emit the visible light. Specifically, for example, the size of the quantum dots of the channel layer 24 is controlled to emit red light, green light, and blue light.

The channel layer 24 may have a host material into which the quantum dots are mixed. The host material may include an organic host material that has been used in organic electroluminescence (EL). The host material may include, for example, triphenylamine derivatives, arylamine dielectrics, oxadiazole derivatives, anthracene derivatives, carbazole derivatives, phenanthrolines, or the like. The triphenylamine derivative is, for example, N,N'-bis-(3-methylphenyl)-N,N'-bis-(phenyl)-benzidine (TPD) or 4,4', 4"-tris(3-methylphenylphenylamino)triphenylamine (MTDATA). For example, the arylamine dielectric is bis(N-(1-naphthyl-N-phenyl)benzidine) (α-NPD). For example, the oxadiazole derivative is (2-(4-biphenylyl)-5-(4-tert-butylphenyl)-1,3,4-oxadiazole) (PB D). For example, the anthracene derivative is 9,10-di-2-naphthylanthracene (DNA). Carbazole derivatives are 4,4-N,N'-dicarbazole-biphenyl (CBP) or 1,4-bis(2,2-diphenylvinyl)benzene (DPVBi). For example, phenanthrolines are bathocuproin, bathophenanthroline, or the like. In addition, the host material may include phthalocyanine derivatives, polythiophene derivatives, and porphyrin derivatives, which are electron transporting materials.

As one example of the display device 1, the gate electrode 21 is formed on a side opposite to the electrodes 22 and 23 across the channel layer 24. In FIG. 3A and FIG. 3B, the gate electrode 21 is formed under the channel layer 24, and the first electrode 22 and the second electrode 23 are formed on the upper side of the channel layer 24. The first electrode 22 is connected to one edge of the channel layer 24 and the second electrode 23 is connected to the opposite edge of the channel layer 24. The channel layer 24 is an elongated rectangle in a direction of a channel width (Dw direction in FIG. 3A). It is desirable that a channel width of the channel layer 24 corresponds to the pixel size (S in FIG. 3A). The gate electrode 21 is formed on the insulating layer 31. The selection transistor 10 is formed in a layer lower than an insulating layer 31. As will be described below, the insulating layer 31 is formed of, for example, an acrylic resin and functions as a flattening layer having a flat surface. The gate electrode 21 is covered with an insulating layer 32. For example, the insulating layer 32 is formed of $SiO_2$. The channel layer 24 is formed on the insulating layer 32. As illustrated in FIG. 3A and FIG. 3B, the channel layer 24 may be covered with an insulating layer 33. In this case, the first electrode 22 and the second electrode 23 may be connected to the channel layer 24 via through holes. Unlike examples of FIGS. 3A and 3B, the first electrode 22 and the second electrode 23 may be directly formed on the channel layer 24.

Metals such as aluminum, silver, copper, and nickel may be used as materials of the gate electrode 21, the first electrode 22, and the second electrode 23. Alternatively, a transparent conductive material such as ITO and IZO may be used as the material of these electrodes. In a case where the display device 1 is a top emission type, the gate electrode 21 includes a reflecting surface for reflecting light. For example, the reflecting surface is formed of metals such as aluminum and silver. In a case where the display device 1 is a bottom emission type, the gate electrode 21 is formed of the above-described transparent conductive material. The gate electrode 21 may have a plurality of conductive layers. A material of the first electrode 22 and a material of the second electrode 23 may be different from each other. The work function of the first electrode 22 and the work function of the second electrode 23 can be made different from each other by using different materials as the first electrode 22 and the second electrode 23. As a result, it is possible to improve carrier injection efficiency into the channel layer 24.

The channel layer 24 is formed of the quantum dots and the host material. The channel layer 24 includes a region (first region 24a) in contact with the first electrode 22, a region (second region 24b) in contact with the second electrode 23, and the third region 24c between the first region 24a and the second regions 24b. At least one region of the first region 24a and the second region 24b may have a composition different from that of the third region 24c. For example, ions (for example, lithium ion, potassium ion, argon ion, nitrogen ion, or hydrogen ion) may be doped as impurities into the first region 24a and the second region 24b. The impurities may increase the carrier injection efficiency from the first electrode 22 or the second electrode 23 to the channel layer 24. The impurities may not necessarily be such ions.

As illustrated in FIG. 2, a storage capacitor 26 connected to the second source/drain electrode 13 of the selection transistor 10 may be provided in each pixel. When the selection transistor 10 is in the turn ON state thereof, if a voltage corresponding to a gradation value of the pixel is applied to the signal lines 52, electric charges are stored in the storage capacitor 26. As a result, even if the selection transistor 10 becomes in the turn OFF state, a potential of the gate electrode 21 of the light-emitting transistor 20 is maintained. For example, the other electrode of the storage capacitor 26 is connected to the first line 53. For example, the storage capacitor 26 is formed in a layer lower than the insulating layer 31 illustrated in FIG. 3A and FIG. 3B.

In a case where the channel layer 24 has bipolarity, that is, in a case where the channel layer 24 has a hole transporting property and an electron transporting property, the light-emitting transistor 20 can be operated as follows. For example, by potential difference between the first electrode 22 and the second electrode 23, electrons are injected from the first electrode 22 into the channel layer 24 and holes are injected from the second electrode 23 into the channel layer 24. The potential of the gate electrode 21 is set to move the injected carriers (electrons and holes) toward the vicinity of the center of the channel layer 24 (near center of channel). The carriers move in the host material or move among quantum dots by tunneling phenomenon, hopping phenomenon, or the like. The electrons and holes reaches the vicinity of the center of the channel layer 24 and are taken into the quantum dots to recombine and generate excitons. As a result, the quantum dots emit light. The amount of the transported carriers in the channel layer 24 depends not only on the potential difference between the first electrode 22 and the second electrode 23, but also on the potential of the gate electrode 21. That is, in a state where a voltage is not applied to the gate electrode 21, the channel layer 24 has high insulation. The electric conductivity of the channel layer 24 increases by applying a voltage to the gate electrode 21. In addition, the electron density of the quantum dots depends on the potential of the gate electrode 21. Electron movement between the quantum dots depends on the electron density of the quantum dots. For example, in a case where the electron density in the quantum dots is high, the electrons are confined in the quantum dots and cannot move among the quantum dots because electric interaction works between electrons in a quantum dot and electrons in an adjacent quantum dot. For these reasons, the recombination probability of electrons and holes can be controlled by the potential of the gate electrode 21, and the emission luminance can be controlled.

The concentration of the quantum dots in the host material may not be necessarily uniform in the channel layer 24. That is, the concentration of the quantum dots in the host material may have a gradient in a direction of a channel length in the host material. For example, the concentration of the quantum dots in the vicinity of the center of the channel layer 24 may be thinner than that of the other portions (portion close to first electrode 22 and portion close to second electrode 23). That prevents the light emitting region of the channel layer 24 from localizing in the vicinity of the center.

In a case where the channel layer 24 has unipolarity, that is, in a case where the channel layer 24 has only one of the hole transporting property and the electron transporting property, the light-emitting transistor 20 can be operated as follows. For example, in a case where the channel layer 24 has the electron transporting property and the first electrode 22 is set a potential lower than that of the second electrode 23, the electrons are injected from the first electrode 22 to the channel layer 24. The injected electrons are transported toward the second electrode 23. The quantum dots are excited by collisions between the electrons and the quantum dots in a transporting process of the electrons, and/or the electrons enter a high energy level of the quantum dots in the transporting process of the electrons. Therefore, the quantum dots emit light due to deactivation. In a case where the holes are slightly injected from the second electrode 23 into the channel layer 24, the holes and the electrons are taken into the quantum dots in a contact region between the second electrode 23 and the channel layer 24 and recombine to generate the excitons. As a result, the quantum dots can emit light. The amount of the transported carriers in the channel layer 24 depends not only on the potential difference between the first electrode 22 and the second electrode 23, but also on the potential of the gate electrode 21. That is, in a state where a voltage is not applied to the gate electrode 21, the channel layer 24 has high insulation. The electric conductivity of the channel layer 24 increases by applying a voltage to the gate electrode 21. In addition, the electron density of the quantum dots depends on the potential of the gate electrode 21. Electron movement between the quantum dots depends on the electron density of the quantum dots. For example, in a case where the electron density in the quantum dots is high, the electrons are confined in the quantum dots and cannot move among the quantum dots because electric interaction works between electrons in a quantum dot and electrons in an adjacent quantum dot. For these reasons, the recombination probability of electrons and holes can be controlled by the potential of the gate electrode 21, and the emission luminance can be controlled.

When a turn ON voltage (scan signal) is applied from the scan line driving circuit to a scan line, the selection transistor 10 becomes the turn ON state. At this time, a voltage corresponding to a gradation value of the pixel (gradation signal) is applied to the signal line from the signal line driving circuit. As a result, a voltage corresponding to the gradation value is applied to the gate electrode 21 of the light-emitting transistor 20 via the selection transistor 10. As a result, carriers corresponding to the gradation value flows through the channel layer 24.

Figure 4:
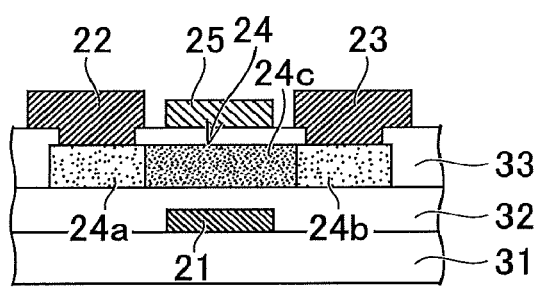
FIG. 4 is a diagram illustrating a modification example of the light-emitting transistor.

FIG. 4 is a sectional view illustrating a modification example of the light-emitting transistor 20. As illustrated in FIG. 4, the light-emitting transistor 20 may include an auxiliary electrode 25 on a side opposite to the gate electrode 21 across the channel layer 24. As an example, the auxiliary electrode 25 is set to the same potential as that of the gate electrode 21. The auxiliary electrode 25 enables the amount of the transported carriers and the carrier density in the channel layer 24 to be easily controlled. Further, the auxiliary electrode 25 enables the operation of the light-emitting transistor 20 to be stabilized and reduces the change in the operation of the light-emitting transistor 20. As the material of the auxiliary electrode 25, a metal such as aluminum, silver, copper, and nickel may be used. As the material of the auxiliary electrode 25, the transparent conductive material such as ITO and IZO may be used. In a case where the display device 1 is the top emission type, the auxiliary electrode 25 is formed of the transparent conductive material. In a case where the display device 1 is the bottom emission type, the auxiliary electrode 25 has the reflecting surface for reflecting light. For example, the reflecting surface is formed of a metal such as aluminum and silver.

Figure 5A:
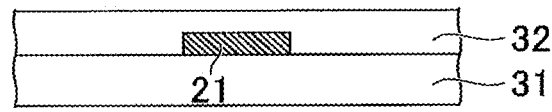
FIGS. 5A, 5B, 5C, 5D, and 5E are diagrams illustrating a manufacturing process of the light-emitting transistor illustrated in FIG. 4.
Figure 5B:
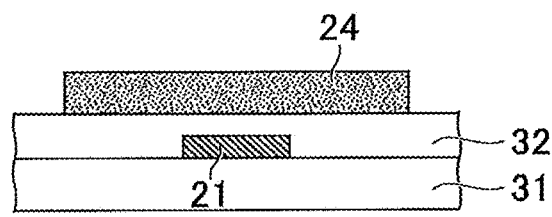
Figure 5C:
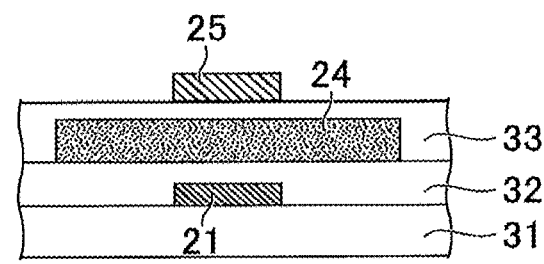
Figure 5D:
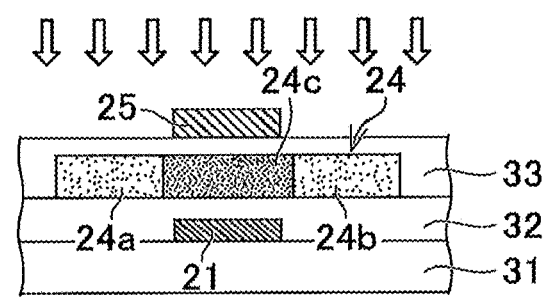
Figure 5E:
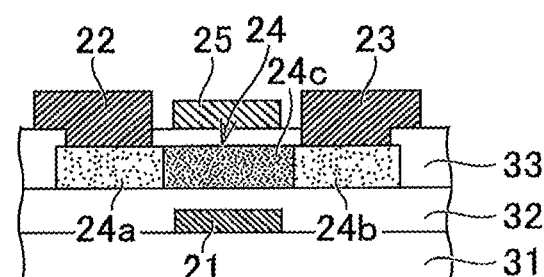

FIGS. 5A, 5B, 5C, 5D, and 5E are diagrams illustrating an example of a manufacturing process of the light-emitting transistor 20. As illustrated in FIG. 5A, first, the gate electrode 21 is formed on the insulating layer 31. The gate electrode 21 may be formed by a sputtering method, an evaporation method, or the like. The gate electrode 21 is covered with the insulating layer 32. Next, as illustrated in FIG. 5B, the channel layer 24 is formed on the insulating layer 32. The channel layer 24 is formed of the above-described material. For example, the channel layer 24 may be formed by a coating method, a transfer method, or the like. In the coating method, a coating solution containing the quantum dots and the host material is coated on the insulating layer 32. In the transfer method, a channel layer formed on a film by the coating method or an evaporation method is transferred and bonded to the insulating layer 32. The channel layer 24 is covered with the insulating layer 33. Next, as illustrated in FIG. 5C, the auxiliary electrode 25 is formed on the insulating layer 33. The auxiliary electrode 25 may be also formed by the sputtering method, the evaporation method, or the like. As illustrated in FIG. 5D, nitrogen ions and hydrogen ions are implanted into the first region 24a and the second region 24b of the channel layer 24. In a process of FIG. 5D, the auxiliary electrode 25 may function as a mask, or a dedicated mask may be used. Next, through holes are formed on the insulating layer 33. The through holes are formed at a location corresponding to the first region 24a of the channel layer 24 and a location corresponding to the second region 24b. As illustrated in FIG. 5E, the first electrode 22 and the second electrode 23 are formed on the insulating layer 33, and these electrodes 22 and 23 are connected to the channel layer 24 via through holes. For example, the electrodes 22 and 23 are formed by the sputtering method, the evaporation method, or the like. In a case of the light-emitting transistor 20 not including the auxiliary electrode 25, that is, in a case of forming the light-emitting transistor 20 illustrated in FIG. 3A and FIG. 3B, a mask is disposed on the insulating layer 33, and the nitrogen ions and the hydrogen ions are implanted into the channel layer 24, in the process of FIG. 5D.

Figure 6:
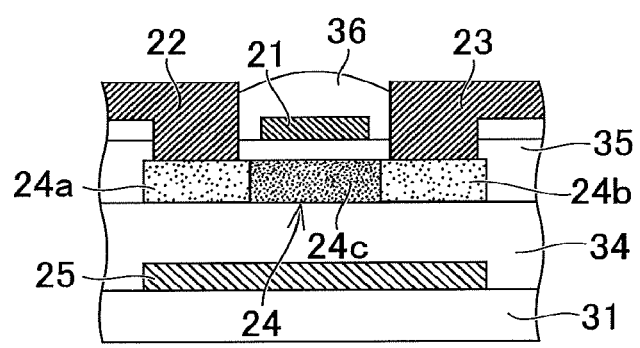
FIG. 6 is a diagram illustrating another modification example of the light-emitting transistor.

FIG. 6 is a sectional view illustrating another modification example of the light-emitting transistor 20. As illustrated in FIG. 6, the gate electrode 21 may be formed on the same side of the first electrode 22 and the second electrode 23 with respect to the channel layer 24. In FIG. 6, the channel layer 24 is covered with an insulating layer 35, and the gate electrode 21 is formed on the insulating layer 35. For example, the insulating layer 35 is formed of $SiO_2$. The gate electrode 21 is covered with an insulating layer 36. The insulating layer 36 is formed of $SiO_2$ and SiN. The first electrode 22 and the second electrode 23 are formed on the insulating layer 36. The first electrode 22 and the second electrode 23 are connected to the channel layer 24 via through holes formed in the insulating layers 35 and 36. As illustrated in FIG. 6, the auxiliary electrode 25 is formed on a side opposite to the gate electrode 21 across the channel layer 24. That is, the auxiliary electrode 25 is formed on a lower side of the channel layer 24, and an insulating layer 34 may be formed between the channel layer 24 and the auxiliary electrode 25. For example, the insulating layer 34 is also formed of $SiO_2$. In an example of FIG. 6, the auxiliary electrode 25 is formed on the insulating layer 3l which functions as the flattening layer. The auxiliary electrode 25 may not be necessarily formed. In an example of FIG. 6 as well, at least one region of the first region 24a (region in contact with first electrode 22) and the second region 24b (region in contact with the second electrode 23) of the channel layer 24 may have a composition different from that of the third region 24c between the first region 24a and the second region 24b. Ions (for example, nitrogen ions or hydrogen ions) may be doped into the first region 24a and the second region 24b as the impurities. The impurities may not necessarily be such ions.

Figure 7A:
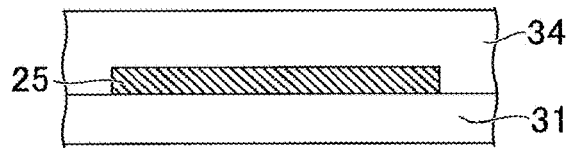
FIGS. 7A, 7B, 7C, and 7D are diagrams illustrating a manufacturing process of the light-emitting transistor illustrated in FIG. 6.
Figure 7B:
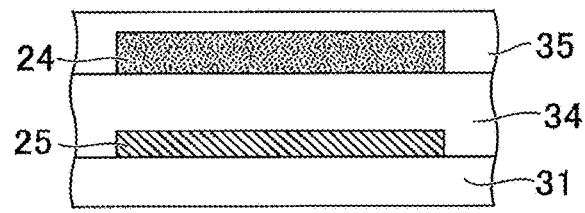
Figure 7C:
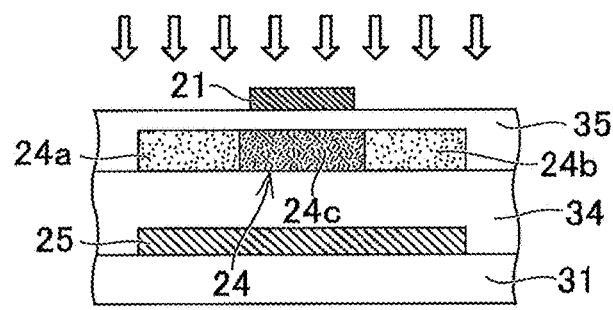
Figure 7D:
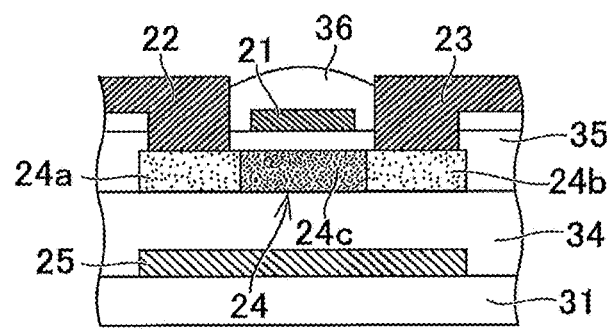

FIGS. 7A, 7B, 7C, and 7D are diagrams illustrating an example of a manufacturing process of the light-emitting transistor 20 illustrated in FIG. 6. As illustrated in FIG. 7A, the auxiliary electrode 25 is formed on the insulating layer 31. The auxiliary electrode 25 may also be formed by the sputtering method, the evaporation method, or the like. The auxiliary electrode 25 is covered with the insulating layer 34. Next, as illustrated in FIG. 7B, the channel layer 24 is formed on the insulating layer 34. Similar to the example of FIG. 5, the channel layer 24 is formed by the coating method, the transfer method, or the like. The channel layer 24 is covered with the insulating layer 35. Next, as illustrated in FIG. 7C, the gate electrode 21 is formed on the insulating layer 35. For example, the gate electrode 21 is formed by the sputtering method, the evaporation method, or the like. Then, the nitrogen ions and the hydrogen ions are implanted into the first region 24a and the second region 24b of the channel layer 24. In this process, the gate electrode 21 may function as a mask, or a dedicated mask may be used. Next, as illustrated in FIG. 7D, the gate electrode 21 is covered with the insulating layer 36. Through holes are formed in the insulating layers 35 and 36. The through holes are formed at a location corresponding to the first region 24a of the channel layer 24 and a location corresponding to the second region 24b. Then, the first electrode 22 and the second electrode 23 are formed on the insulating layer 36, and these electrodes 22 and 23 are connected to the channel layer 24 via the through holes. The electrodes 22 and 23 are formed by the sputtering method, the evaporation method, or the like. In a case where the light-emitting transistor 20 not including the auxiliary electrode 25 is formed, the channel layer 24 is formed on the insulating layer 31 and processes illustrated in FIGS. 7C and 7D are performed.

Figure 8:
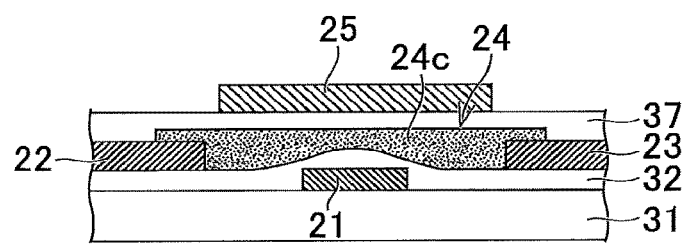
FIG. 8 is a diagram illustrating still another modification example of the light-emitting transistor.

FIG. 8 is a sectional view illustrating still another modification example of the light-emitting transistor 20. As illustrated in FIG. 8, the gate electrode 21, the first electrode 22, and the second electrode 23 may be formed at a lower side of the channel layer 24. The gate electrode 21 is formed on the insulating layer 31, and covered with the above-described insulating layer 32. The first electrode 22 and the second electrode 23 are formed on the insulating layer 32. In addition, the channel layer 24 is formed on the insulating layer 32. One edge portion of the channel layer 24 is formed on the first electrode 22, and the other edge portion of an opposite side to the channel layer 24 is formed on the second electrode 23. The channel layer 24 is covered with an insulating layer 37. The auxiliary electrode 25 may be formed on the insulating layer 37. The auxiliary electrode 25 may not necessarily be formed.

Figure 9:
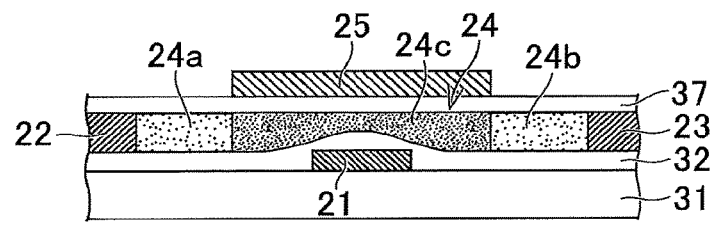
FIG. 9 is a diagram illustrating still another modification example of the light-emitting transistor.

FIG. 9 is a sectional view illustrating still another modification example of the light-emitting transistor 20. In the example of FIG. 9, the gate electrode 21, the first electrode 22, and the second electrode 23 are formed at a lower side of the channel layer 24, similar to FIG. 8. In the example of FIG. 9, the first region 24a (region in contact with first electrode 22) and the second region 24b (region in contact with second electrode 23) of the channel layer 24 may have a composition different from that of the third region 24c between the first region 24a and the second region 24b. For example, ions (for example, nitrogen ions and hydrogen ions) are doped as impurities into the first region 24a and the second region 24b. The impurities may not necessarily be such ions. In the channel layer 24 illustrated in FIG. 9, the channel layer 24 is located between the first electrode 22 and the second electrode 23. This structure enlarges contact areas between the channel layer 24 and the electrodes 22 and 23, compared to the structure where the electrodes 22 and 23 are connected to the channel layer 24 via a contact hole. As a result, electric resistance between the electrodes 22 and 23 and the channel layer 24 is reduced, and thus reliable electric connection can be secured. A cross-sectional shape of each of electrodes 22 and 23 may have a taper angle. That is, an inclined surface may be formed on a contact surface between the electrodes 22 and 23 and the channel layer 24. This structure further increases the contact area, and improves light emission efficiency by surface reflection of the inclined surface. In the example of FIG. 9, the edge portion of the channel layer 24 may be disposed on an upper side of the electrodes 22 and 23.

Figure 10A:
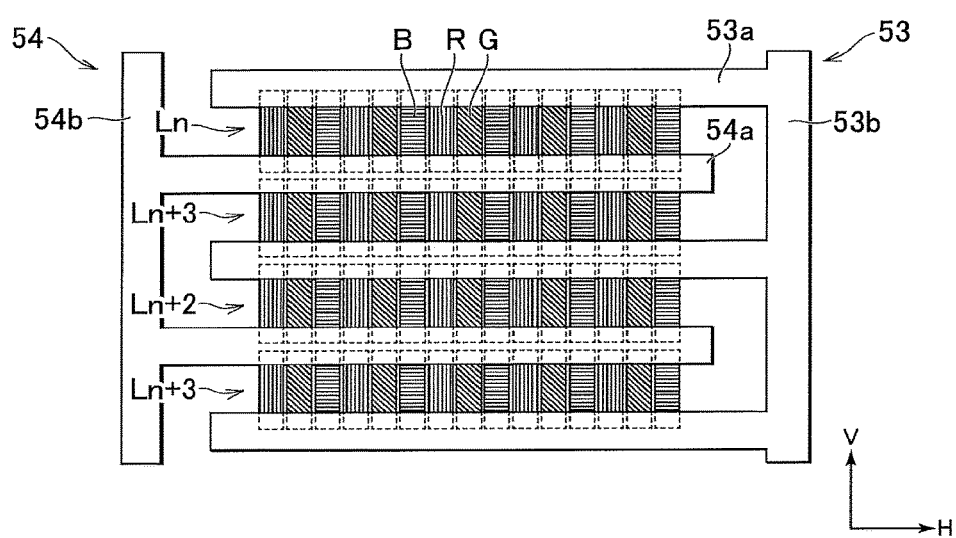
FIG. 10A is a plan view of a TFT substrate.
Figure 10B:
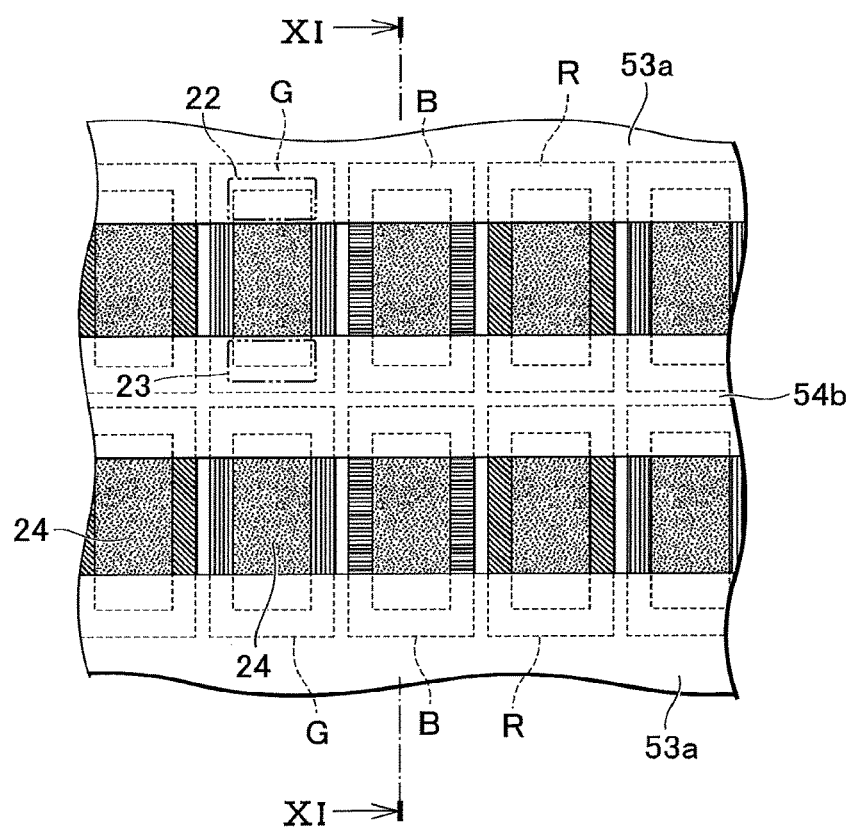
FIG. 10B is an enlarged view of the TFT substrate illustrated in FIG. 10A.
Figure 11:
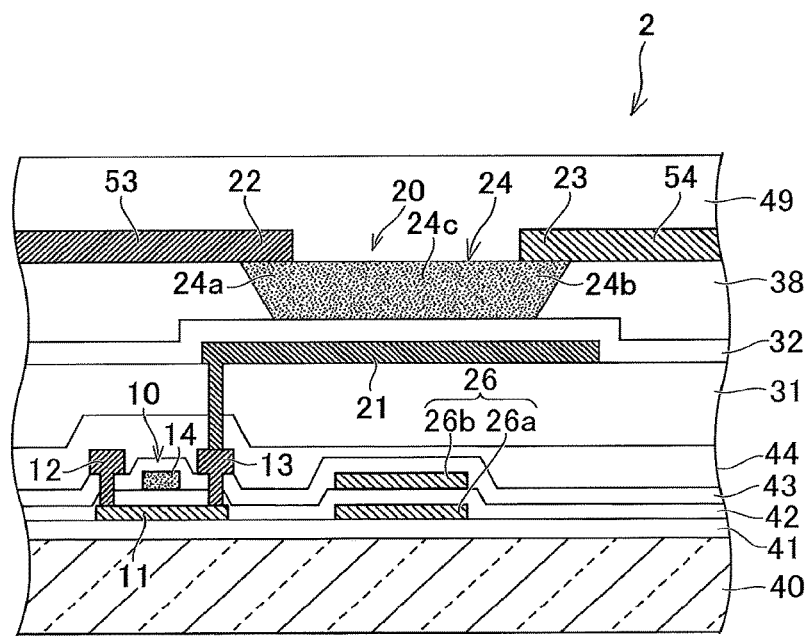
FIG. 11 is a sectional view taken along the line XI-XI illustrated in FIG. 10.

FIGS. 10A and 10B, and FIG. 11 are diagrams illustrating an example of the TFT substrate 2 included in the display device 1. FIG. 10A is a plan view. FIG. 10B is an enlarged view of FIG. 10A. FIG. 11 is a sectional view taken along the line XI-XI illustrated in FIG. 10B.

As illustrated in FIG. 11, the TFT substrate 2 includes a substrate 40 formed of glass, resin, or the like. In a case where the display device 1 is the top emission type, the substrate 40 may be transparent, or may be opaque. In a case where the display device 1 is the bottom emission type, the substrate 40 is a transparent substrate. The selection transistor 10 is formed on the substrate 40. As an example, a semiconductor layer 11 is formed on the substrate 40. For example, the semiconductor layer 11 is amorphous silicon. However, polycrystalline silicon, an organic semiconductor, a metal oxide semiconductor, or the like may be used as the semiconductor layer 11. A base layer 41 of $SiO_2$ or SiN may be formed on the substrate 40 and the semiconductor layer 11 may be formed on the base layer 41. The semiconductor layer 11 is covered with an insulating layer 42, and the gate electrode 14 is formed on the insulating layer 42. The scan lines 51 may be formed on a conductive layer which is the same layer as the semiconductor layer 11. The gate electrode 14 is covered with an interlayer insulating layer 43, and the first source/drain electrode 12 and the second source/drain electrode 13 are formed on the interlayer insulating layer 43. The source/drain electrodes 12 and 13 are connected to the semiconductor layer 11 via through holes. The source/drain electrodes 12 and 13 are covered with a passivation layer 44. A laminated structure of the selection transistor 10 is not limited to a structure illustrated in FIG. 11. For example, in the selection transistor 10, the semiconductor layer 11 may be formed on an upper side of the gate electrode 14.

The above-described insulating layer 31 is formed on the passivation layer 44. For example, the insulating layer 31 functions as the flattening layer having a flattened surface. For example, the flattening layer is formed of an acrylic resin. The light-emitting transistor 20 is formed on the insulating layer 31.

As an example, similar to the examples of FIG. 3A and FIG. 3B, the gate electrode 21 is formed on the insulating layer 31. The gate electrode 21 is connected to the second source/drain electrode 13 of the selection transistor 10 via a through hole. The through hole is formed in the insulating layer 31 and the passivation layer 44. The channel layer 24 including the quantum dots is formed on an upper side of the gate electrode 21. The gate electrode 21 is covered with the insulating layer 32, and the channel layer 24 is formed on the insulating layer 32. The channel layer 24 is separated between adjacent two pixels. That is, the channel layer 24 of one pixel and the channel layer 24 of the other pixel are not connected to each other. As illustrated in FIG. 11, a size of the gate electrode 21 may be greater than that of the channel layer 24. That is, the channel layer 24 may be presented inside an outer peripheral edge of the gate electrode 21 in a plan view. This structure prevents uneven surface of the channel layer 24. For example, the display device 1 is the top emission type. In this case, the gate electrode 21 has the reflecting surface as described above. The entirety of the gate electrode 21 may be formed of a material which reflects light, and the gate electrode 21 is formed of a plurality of the conductive layers such that a part thereof may be formed of the material which reflects light.

As described above, the display device 1 has the plurality of pixels which emit light beams of mutually different colors. For example, as illustrated in FIG. 10A and FIG. 10B, the display device 1 has three pixels of red pixels (R), green pixels (G), and blue pixels (B). An emission wavelength (color) from the quantum dots depends on the size of the quantum dots. Therefore, as an example of the display device 1, the channel layers 24 of the plurality of pixels include a plurality of types of quantum dots having different sizes, respectively. That is, the channel layer 24 of the pixel (for example, red pixel (R)) of the first color, the channel layer 24 of the pixel (for example, green pixels (G)) of the second color, and the channel layer 24 of the pixel (for example, blue pixels (B)) of the third color include three types of the quantum dots having different sizes, respectively.

The size of the quantum dots may be the same in the plurality of pixels having different colors. For example, the quantum dots of the pixel (for example, red pixel (R)) of the first color, the quantum dots of the pixel (for example, green pixels (G)) of the second color, and the quantum dots of the pixel (for example, blue pixels (B)) of the third color may have the same size. In this case, the color of each pixel may be realized by using a color filter or a color conversion filter. The color filter or the color conversion filter may be formed on the counter substrate 3, or may be formed on the TFT substrate 2. In this case, the channel layer 24 of each pixel may include the quantum dots of the plurality of types having different sizes. For example, the channel layer 24 may have a plurality of layers which are formed with the quantum dots having different sizes, respectively. That is, the channel layer 24 may have a layer of the quantum dots having a first size, a layer of the quantum dots having a second size, and a layer of the quantum dots having a third size. The number of layers of the quantum dots may be more than three or less than three.

As shown in FIG. 11, the first electrode 22 and the second electrode 23 are formed on the channel layer 24. The first electrode 22 is electrically connected to one edge portion of the channel layer 24, and the second electrode 23 is electrically connected to an edge portion of an opposite side of the channel layer 24. As illustrated in FIG. 11, the first electrode 22, the second electrode 23, and the channel layer 24 may be covered with a protective layer 49. Accordingly, the counter substrate 3 (FIG. 1) may be disposed on an upper side of the protective layer 49.

As illustrated in FIG. 11, an insulating layer 38 having an opening in each pixel may be formed on the insulating layer 32. A location of the opening of the insulating layer 38 corresponds to a location of the gate electrode 21. The channel layer 24 is formed inside the opening of the insulating layer 38, and opposes the gate electrode 21 across the insulating layer 32. For example, as the material of the insulating layer 38, an acrylic resin may be used. The first electrode 22 and the second electrode 23 are formed on the insulating layer 38. Parts of the electrodes 22 and 23 are located on the channel layer 24, and connected to the channel layer 24.

As described above, the first line 53 and the second line 54 are formed on the TFT substrate 2. As an example, as illustrated in FIG. 11, the lines 53 and 54 are formed on the insulating layer 38. In this case, a part of the first line 53 is the first electrode 22, and a part of the second line 54 is the second electrode 23. A layer on which the lines 53 and 54 are formed is not limited to the layer illustrated in FIG. 11. As will be described below, the first line 53 and the second line 54 may be formed on a layer lower than the channel layer 24.

As illustrated in FIG. 10B, the plurality of pixels (in examples of FIG. 10A and FIG. 10B, red pixel (R), green pixels (G), and blue pixels (B)) having different colors are regularly arranged in a horizontal direction. Each pixel is rectangular, and a width of the pixel in the vertical direction is wider than a width of the pixel in a horizontal direction (V direction in FIG. 10A and FIG. 10B is "vertical direction", and H direction is "horizontal direction"). The channel layer 24 is also rectangular according to the shape of the pixel.

The first electrode 22 is connected to one edge in the vertical direction of the channel layer 24 and the second electrode 23 is connected to an opposite edge portion thereof in the vertical direction of the channel layer 24. Locations of the first electrode 22 and the second electrode 23 are provided are not limited to the examples of FIG. 10A and FIG. 10B. For example, the first electrode 22 may be connected to one edge portion of the channel layer 24 in the horizontal direction, and the second electrode 23 may be connected to an edge portion of an opposite side to the channel layer 24 in the horizontal direction. That is, in a case where a width of the channel layer 24 in a first direction is greater than a width in a second direction orthogonal to the first direction, the first electrode 22 and the second electrode 23 may be located on opposite sides in the second direction.

The TFT substrate 2 has a plurality of pixel rows L (subscripts n to n+3 are assigned to each pixel row L in FIG. 10A and FIG. 10B). The plurality of pixels are arranged in one direction in each pixel row L. Each pixel row L is formed by the plurality of pixels arranged in the horizontal direction. The plurality of pixel rows L are arranged in the vertical direction. As illustrated in FIG. 10A and FIG. 10B, the plurality of pixels (in examples of FIG. 10A and FIG. 10B, red pixel (R), green pixels (G), and blue pixels (B)) having different colors may be regularly arranged in each pixel row. Alternatively, pixels of the same color may be arranged in each pixel row, unlike the examples of FIG. 10A and FIG. 10B.

The first line 53 includes a first extending portion 53a that is located between adjacent two pixel rows L and extends in the horizontal direction. Accordingly, the first extending portion 53a of the first line 53 is connected to the channel layer 24 of the plurality of pixels forming the adjacent two pixel rows L. That is, the first extending portion 53a of the first line 53 forms the first electrode 22 of pixels included in the adjacent two pixel rows L. The first line 53 includes a plurality of the first extending portions 53a. In addition, the first line 53 includes a second extending portion 53b that extends in the vertical direction and is connected to the plurality of first extending portions 53a.

Similar to the first line 53, the second line 54 also includes a first extending portion 54a formed between the adjacent two pixel rows L. Accordingly, the first extending portion 54a of the second line 54 is connected to the channel layer 24 of pixels included in the adjacent two pixel rows L. That is, the first extending portion 54a of the second line 54 forms the second electrode 23 of the plurality of pixels included in the adjacent two pixel rows L. The second line 54 includes a plurality of first extending portions 54a. In addition, the second line 54 includes a second extending portion 54b which extends in the vertical direction and is connected to the plurality of first extending portions 54a. The first extending portion 53a of the first line 53 and the first extending portion 54a of the second line 54 are alternately arranged in the vertical direction. The second extending portion 53b of the first line 53 and the second extending portion 54b of the second line 54 are positioned on opposite sides across the plurality of pixels arranged in the horizontal direction. The arrangement of the lines 53 and 54 is not necessarily limited to the arrangement illustrated in FIG. 10A and FIG. 10B. A voltage may not be simultaneously applied to the plurality of first extending portions 53a and 54a arranged in the vertical direction. For example, a voltage may be sequentially applied to the plurality of first extending portions 53a and 54a in a predetermined manner for each pixel row. In this case, each of the lines 53 and 54 may not include the second extending portions 53b and 54b.

As described above, the storage capacitor 26 is formed in each pixel. The storage capacitor 26 includes two opposing electrodes 26a and 26b. For example, as illustrated in FIG. 11, a first electrode 26a is formed on the same layer as the semiconductor layer 11 of the selection transistor 10. For example, a second electrode 26b is formed on the insulating layer 42. The second electrode 26b may be formed on the interlayer insulating layer 43 similar to the source/drain electrodes 12 and 13. One electrode of the electrodes 26a and 26b is connected to the second source/drain electrode 13 of the selection transistor 10, and the other electrode thereof is connected to, for example, the first line 53 via a through hole.

Figure 12:
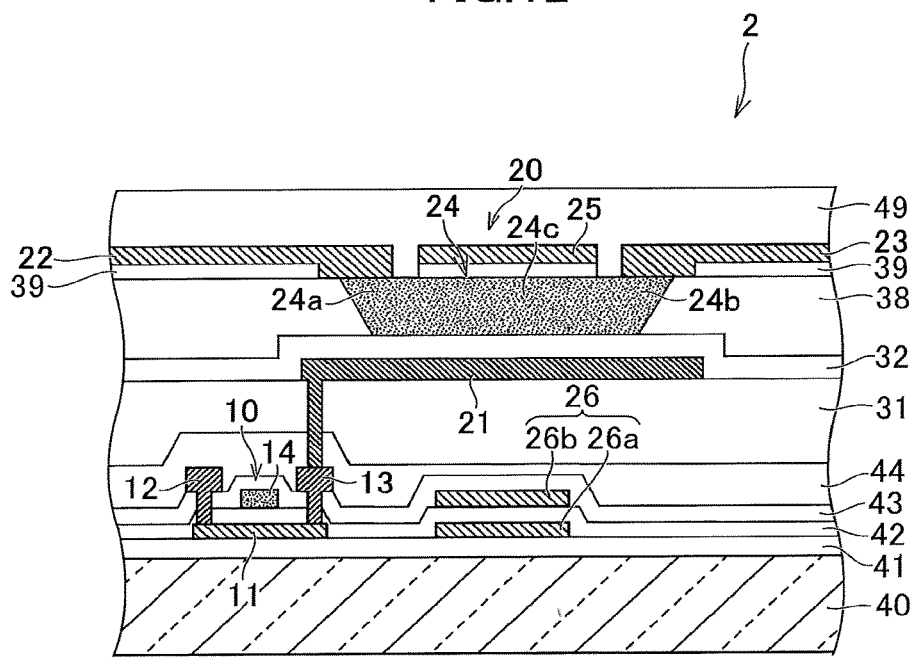
FIG. 12 is a sectional view illustrating a modification example of the TFT substrate.

FIG. 12 is a sectional view illustrating a modification example of the TFT substrate 2. In FIG. 12, the same reference numerals are given to the same portions as those described above. As illustrated in FIG. 12, the light-emitting transistor 20 of each pixel may include the auxiliary electrode 25 which is located on an opposite side to the gate electrode 21 across the channel layer 24. In an example of FIG. 12, an insulating layer 39 is formed on the channel layer 24. The auxiliary electrode 25 is formed on the insulating layer 39. For example, the auxiliary electrode 25 is connected to the gate electrode 21 via a through hole (not illustrated).

Figure 13A:
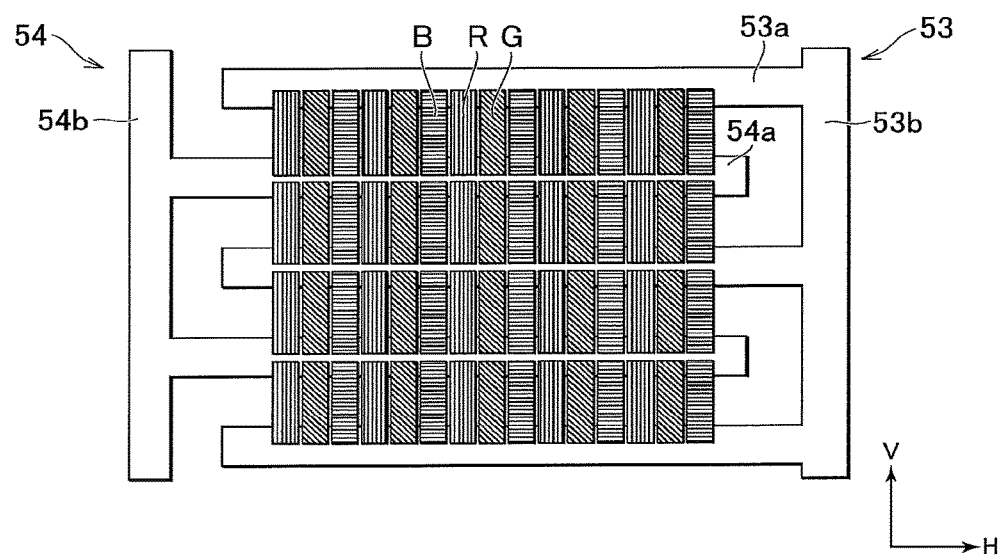
FIG. 13A is a plan view illustrating another modification example of the TFT substrate.
Figure 13B:
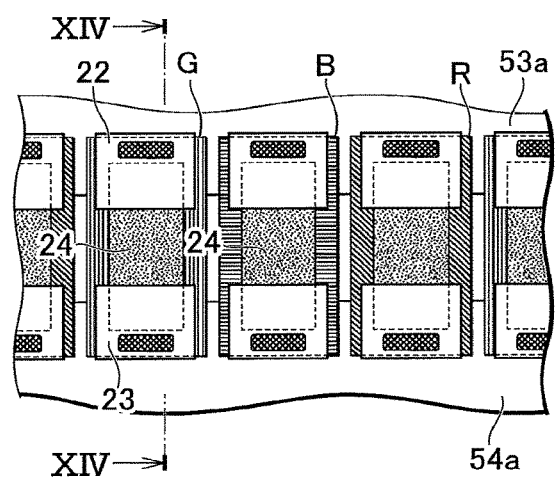
FIG. 13B is an enlarged view of the TFT substrate illustrated in FIG. 13A.
Figure 14:
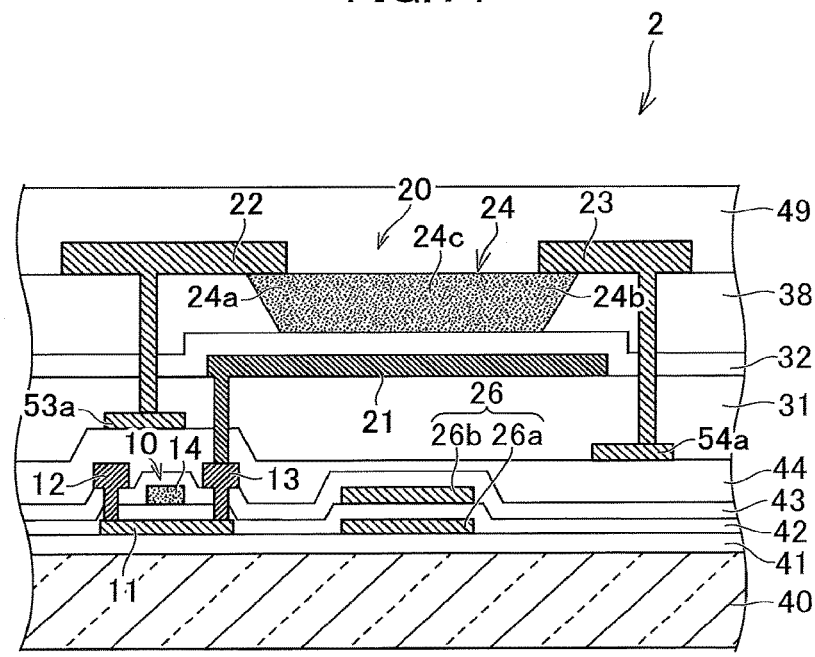
FIG. 14 is a sectional view taken along the line XIV-XIV illustrated in FIG. 13.

FIGS. 13A and 13B and FIG. 14 are views illustrating still another modification example of the TFT substrate 2. FIG. 13A is a plan view. FIG. 13B is an enlarged view of FIG. 13A. FIG. 14 is a sectional view taken along line XIV-XIV illustrated in FIG. 13B. In these figures, the same reference numerals are given to the same portions as those described so far.

In the examples of these figures, the first line 53 and the second line 54 are formed on a layer lower than the channel layer 24. Specifically, the first line 53 and the second line 54 are formed on the passivation layer 44, and covered with the insulating layer 31. The first electrode 22 and the second electrode 23 are connected to the first line 53 and the second line 54 via through holes, respectively. As described above, the first line 53 includes the first extending portion 53a formed between the adjacent two pixel rows L. The first extending portion 53a is connected to the first electrode 22 via through holes formed in the insulating layers 31, 32, and 38. Similarly, the second line 54 includes the first extending portion 54a formed between the adjacent two pixel rows L. The first extending portion 54a is connected to the second electrode 23 via the through holes formed in the insulating layers 31, 32, and 38. Also in examples of FIG. 13A, FIG. 13B, and FIG. 14, the auxiliary electrode 25 may be formed on an opposite side to the gate electrode 21 across the channel layer 24.

Figure 15:
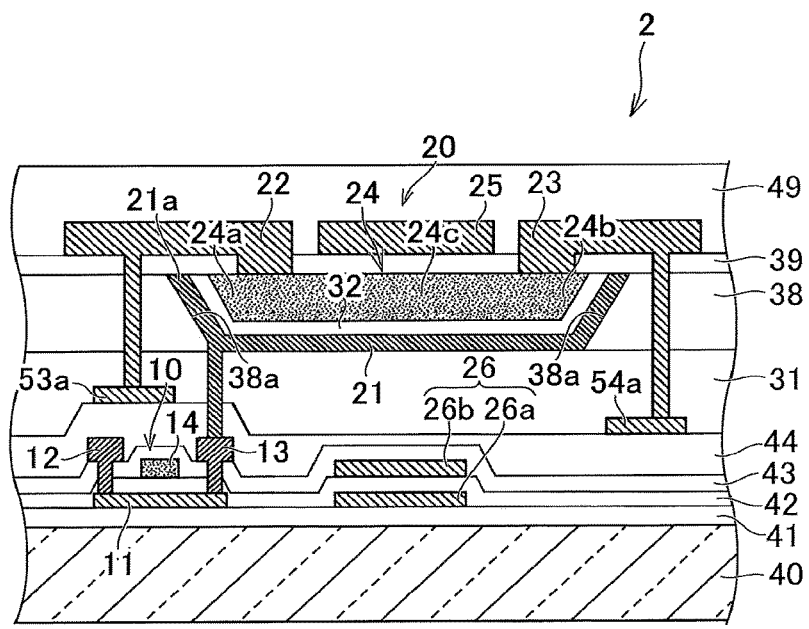
FIG. 15 is a sectional view illustrating still another modification example of the TFT substrate.

FIG. 15 is a sectional view illustrating a further modification example of the TFT substrate 2. In FIG. 15, the same reference numerals are given to the same portions as those described so far.

In an example of FIG. 15, the insulating layer 38 is formed on the insulating layer 31. As described above, the insulating layer 38 includes an opening in each pixel. The gate electrode 21 and the channel layer 24 are formed inside of the opening of the insulating layer 38. Specifically, the insulating layer 32 is formed on the gate electrode 21, and the channel layer 24 is formed on the insulating layer 32. The insulating layer 38 includes an inclined surface 38a on an inner peripheral surface of the opening. An outer peripheral portion 21a of the gate electrode 21 is formed on the inclined surface 38a of the insulating layer 38. Therefore, the outer peripheral portion 21a of the gate electrode 21 is inclined diagonally downward toward the center of each pixel. In addition, in the example of FIG. 15, the gate electrode 21 includes the reflecting surface which reflects light from the channel layer 24. According to the outer peripheral portion 21a of the gate electrode 21, light which is emitted from the channel layer 24 and advanced in a direction along the substrate 40, is reflected on the outer peripheral portion 21a of the gate electrode 21, and emitted from a surface of the display device 1. In the example of FIG. 15, each pixel includes the auxiliary electrode 25 located on an opposite side to the gate electrode 21 across the channel layer 24. The auxiliary electrode 25 may not be necessarily formed.

The laminated structure of the light-emitting transistor 20 is not limited to structures illustrated in FIG. 11, FIG. 12, FIG. 14, and FIG. 15. For example, the gate electrode 21, the first electrode 22, and the second electrode 23 may be formed on the same side of the channel layer 24. For example, in the laminated structures illustrated in FIG. 11, FIG. 12, and FIG. 14, the gate electrode 21 may be formed on an upper side of the channel layer 24. In this case, the gate electrode 21 is covered with an insulating layer, and the first electrode 22 and the second electrode 23 may be formed on an upper side of the insulating layer.

While there have been described what are at present considered to be certain embodiments of the invention, it will be understood that various modifications may be made thereto, and it is intended that the appended claims cover all such modifications as fall within the true spirit and scope of the invention.

What is claimed is:

1. A display device comprising:
a plurality of pixels;
a scan line;
a signal line;
a first line;
a second line; and
an insulating layer that includes an opening in each of the plurality of pixels,
wherein at least one pixel among the plurality of pixels includes
a selection transistor that includes a gate electrode connected to the scan line, a first source/drain electrode connected to the signal line, and a second source/drain electrode, and
a light-emitting transistor that includes a gate electrode to which a voltage corresponding to a gradation value of the at least one pixel is applied through the second source/drain electrode of the selection transistor, a first electrode connected to the first line, a second electrode connected to the second line, and a channel layer including quantum dots, and controls the quantum dots to emit light by carriers flowing through the channel layer,
the channel layer of the light-emitting transistor is disposed inside the opening of the insulating layer,
the first electrode and the second electrode of the light-emitting transistor are formed on upper sides of the channel layer and the insulating layer, and
the gate electrode of the light-emitting transistor includes a reflecting surface that reflects light from the quantum dots.

2. The display device according to claim 1,
wherein the channel layer of the light-emitting transistor is formed on an upper side of the gate electrode of the light-emitting transistor.

3. The display device according to claim 1,
wherein the gate electrode, the first electrode, and the second electrode of the light-emitting transistor are formed on an upper side of the channel layer.

4. The display device according to claim 1,
wherein the opening of the insulating layer has an inclined surface on an inner peripheral surface thereof,
the channel layer of the light-emitting transistor and the gate electrode of the light-emitting transistor are formed inside the opening of the insulating layer, and
an outer peripheral portion of the gate electrode of the light-emitting transistor is formed on the inclined surface of the opening of the insulating layer.

5. The display device according to claim 1,
wherein the light-emitting transistor includes an auxiliary electrode that is formed on an opposite side to the gate electrode across the channel layer therebetween.

6. The display device according to claim 1,
wherein the at least one pixel of the plurality of pixels has a first pixel and a second pixel adjacent to the first pixel, and
a size of the quantum dots of the first pixel and a size of the quantum dots of the second pixel are different from each other.

7. The display device according to claim 1,
wherein the plurality of pixels has a first pixel, a second pixel, a third pixel, and a fourth pixel,
the first pixel and the second pixel form a first row,
the third pixel and the fourth pixel form a second row, and
one line of the first line and the second line is located between the first row and the second row, and overlaps with the channel layer of the first pixel, the second pixel, the third pixel, and the fourth pixel in plan view.

8. The display device according to claim 1,
wherein the first line and the second line are alternately arranged in plan view.

9. The display device according to claim 1,
wherein the channel layer of the light-emitting transistor includes a first region in contact with the first electrode, a second region in contact with the second electrode, and a third region between the first region and the second region, and
impurities are added into at least one region of the first region and the second region.

10. The display device according to claim 1,
wherein a concentration of the quantum dots in the channel layer has a gradient between the first electrode and the second electrode.

11. A display device comprising:
a plurality of pixels;
a scan line;
a signal line;
a first line;
a second line; and
an insulating layer that includes an opening in each of the plurality of pixels,
wherein at least one pixel among the plurality of pixels includes
a selection transistor that includes a gate electrode connected to the scan line, a first source/drain electrode connected to the signal line, and a second source/drain electrode, and
a light-emitting transistor that includes a gate electrode to which a voltage corresponding to a gradation value of the at least one pixel is applied through the second source/drain electrode of the selection transistor, a first electrode connected to the first line, a second electrode connected to the second line, and a channel layer including quantum dots, and controls the quantum dots to emit light by carriers flowing through the channel layer,
the channel layer of the light-emitting transistor is disposed inside the opening of the insulating layer,
the first electrode and the second electrode of the light-emitting transistor are formed on upper sides of the channel layer and the insulating layer, and
the light-emitting transistor includes an auxiliary electrode that is formed on an opposite side to the gate electrode across the channel layer therebetween.

\* \* \* \* \*